US012431469B2

(12) United States Patent
Mochizuki et al.

(10) Patent No.: US 12,431,469 B2
(45) Date of Patent: Sep. 30, 2025

(54) VERTICALLY STACKED FET WITH STRAINED CHANNEL

(71) Applicant: International Business Machines Corporation, Armonk, NY (US)

(72) Inventors: Shogo Mochizuki, Mechanicville, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 720 days.

(21) Appl. No.: 17/669,788

(22) Filed: Feb. 11, 2022

(65) Prior Publication Data
US 2023/0260971 A1    Aug. 17, 2023

(51) Int. Cl.
*H01L 25/07*    (2006.01)
*H01L 23/00*    (2006.01)
(Continued)

(52) U.S. Cl.
CPC ............ *H01L 25/074* (2013.01); *H01L 24/08* (2013.01); *H01L 24/80* (2013.01); *H01L 25/50* (2013.01);
(Continued)

(58) Field of Classification Search
CPC . H01L 2224/08145; H01L 2224/80895; H01L 2224/80896; H01L 24/08;
(Continued)

(56) References Cited

U.S. PATENT DOCUMENTS

| 7,041,576 B2 * | 5/2006 | Pozder ................. H01L 24/29 |
| | | 438/109 |
| 7,312,134 B2 | 12/2007 | Chidambarrao |

(Continued)

FOREIGN PATENT DOCUMENTS

| EP | 4476768 A1 | 12/2024 |
| JP | 2008-004577 A | 1/2008 |
| WO | 2023/151950 A1 | 8/2023 |

OTHER PUBLICATIONS

Written Search Report of WO 2023151950, Apr. 13, 2023 (Year: 2023).*

(Continued)

*Primary Examiner* — Telly D Green
(74) *Attorney, Agent, or Firm* — Matthew Zehrer

(57) ABSTRACT

A stacked semiconductor device includes a lower semiconductor device that has a backside and includes a flipped upper semiconductor device that has a backside that is opposed to the lower semiconductor device backside. The flipped upper semiconductor device further includes a backside residual semiconductor on insulator (SOI) layer and a stressed dielectric portion thereupon. The stacked semiconductor device may be formed by stacking and bonding the flipped upper semiconductor device to the lower semiconductor device, removing one or more semiconductor on insulator (SOI) layers from the backside of the flipped upper semiconductor device while retaining an exposed backside residual SOI layer of the flipped upper semiconductor device, forming a stressed dielectric layer upon the exposed backside residual SOI layer, and patterning the stressed dielectric layer.

14 Claims, 11 Drawing Sheets

(51) Int. Cl.
*H01L 25/00* (2006.01)
*H10D 30/69* (2025.01)

(52) U.S. Cl.
CPC . *H10D 30/798* (2025.01); *H01L 2224/08145* (2013.01); *H01L 2224/80895* (2013.01); *H01L 2224/80896* (2013.01); *H01L 2924/13091* (2013.01)

(58) Field of Classification Search
CPC ....... H01L 24/80; H01L 25/074; H01L 25/50; H01L 2924/13091; H10D 30/792; H10D 30/798; H10D 64/017; H10D 86/01; H10D 86/011; H10D 86/201; H10D 86/215; H10D 88/00
See application file for complete search history.

(56) References Cited

U.S. PATENT DOCUMENTS

| | | | | |
|---|---|---|---|---|
| 7,485,508 | B2* | 2/2009 | Dyer | H10D 86/01 438/459 |
| 7,670,931 | B2* | 3/2010 | Shaviv | H10D 30/798 438/476 |
| 8,476,708 | B2* | 7/2013 | Fukuzumi | H10D 87/00 257/326 |
| 8,723,262 | B2 | 5/2014 | Basker | |
| 9,219,077 | B2* | 12/2015 | Yokoyama | H10D 86/01 |
| 9,356,027 | B1 | 5/2016 | Cheng | |
| 9,515,185 | B2 | 12/2016 | Liu | |
| 9,748,272 | B2* | 8/2017 | Nygaard | H10D 30/6758 |
| 9,755,073 | B1 | 9/2017 | Cheng | |
| 10,084,090 | B2 | 9/2018 | Cheng | |
| 10,727,244 | B2* | 7/2020 | Hwang | H10B 43/35 |
| 10,896,851 | B2 | 1/2021 | Cheng | |
| 2005/0275017 | A1* | 12/2005 | Pozder | H10D 84/038 257/E27.026 |
| 2007/0145367 | A1* | 6/2007 | Chen | H01L 24/83 257/E27.026 |
| 2007/0202654 | A1 | 8/2007 | Ajmera | |
| 2008/0237729 | A1 | 10/2008 | Vandentop et al. | |
| 2008/0286918 | A1* | 11/2008 | Shaviv | H10D 84/0167 257/E21.616 |
| 2010/0224876 | A1* | 9/2010 | Zhu | H01L 23/481 257/E21.597 |
| 2012/0205725 | A1* | 8/2012 | Nygaard | H01L 21/78 438/479 |
| 2012/0248544 | A1* | 10/2012 | Yokoyama | H01L 23/481 438/455 |
| 2012/0329277 | A1* | 12/2012 | Zhu | H10D 84/038 438/667 |
| 2015/0287740 | A1 | 10/2015 | Bedell et al. | |
| 2017/0358265 | A1* | 12/2017 | Wang | G09G 3/3406 |
| 2018/0190670 | A1 | 7/2018 | Ryckaert | |
| 2019/0221484 | A1 | 7/2019 | Hook | |
| 2020/0098776 | A1* | 3/2020 | Sugisaki | H10B 43/35 |
| 2020/0328180 | A1* | 10/2020 | Cheng | H01L 25/18 |
| 2020/0328188 | A1* | 10/2020 | Liu | H01L 25/50 |
| 2020/0350287 | A1* | 11/2020 | Liu | H01L 25/18 |
| 2020/0350320 | A1* | 11/2020 | Cheng | H01L 24/06 |
| 2020/0350321 | A1* | 11/2020 | Cheng | H10D 62/83 |
| 2021/0104523 | A1 | 4/2021 | Fulford | |

OTHER PUBLICATIONS

International Searching Authority, Notification of Transmittal of the International Search Report and the Written Opinion of the International Searching Authority, May 2, 2023, 13 pages, International Application No. PCT/EP2023/051791.

* cited by examiner

VERTICALLY STACKED FET WITH STRAINED CHANNEL

BACKGROUND

Various embodiments of the present application generally relate to semiconductor device fabrication methods and resulting structures. More specifically the various embodiments may relate to a first semiconductor device that includes a FET with a strained channel that is vertically stacked upon a lower second semiconductor device.

SUMMARY

In an embodiment of the present invention, a stacked semiconductor device is presented. The device includes a lower semiconductor device that includes a first metallization layer with a first though metallization layer interconnect. The device further includes a flipped upper semiconductor device that includes a second metallization layer with a second through metallization layer interconnect in contact with the first though metallization layer interconnect. The flipped upper semiconductor device further includes a backside residual semiconductor on insulator (SOI) layer and a first stressed dielectric portion upon the backside residual SOI layer that imparts an intrinsic strain within the backside residual SOI layer.

In an embodiment of the present invention, a stacked semiconductor device is presented. The device includes a lower semiconductor device that includes a first metallization layer with a first though metallization layer interconnect. The device further includes a flipped upper semiconductor device that includes a second metallization layer with a second through metallization layer interconnect in contact with the first though metallization layer interconnect. The flipped upper semiconductor device further includes a backside residual semiconductor on insulator (SOI) layer and a first stressed dielectric portion upon the backside residual SOI layer that imparts an intrinsic strain within an underlying first channel region of the backside residual SOI layer. The flipped upper semiconductor device further includes a second stressed dielectric portion upon the backside residual SOI layer that imparts an intrinsic compressive strain within an underlying second channel region of the backside residual SOI layer.

In another embodiment, a stacked semiconductor device fabrication method is presented. The method includes stacking and bonding a flipped upper semiconductor device comprising a backside to a lower semiconductor device. The method further includes removing one or more semiconductor on insulator (SOI) layers from the backside of the flipped upper semiconductor device while retaining an exposed backside residual SOI layer of the flipped upper semiconductor device. The method further includes forming a stressed dielectric layer upon the exposed backside residual SOI layer of the flipped upper semiconductor device and forming one or more stressed dielectric portions by patterning and removing a portion of the stressed dielectric layer.

These and other embodiments, features, aspects, and advantages will become better understood with reference to the following description, appended claims, and accompanying drawings.

DETAILED DESCRIPTION

Figure 1:
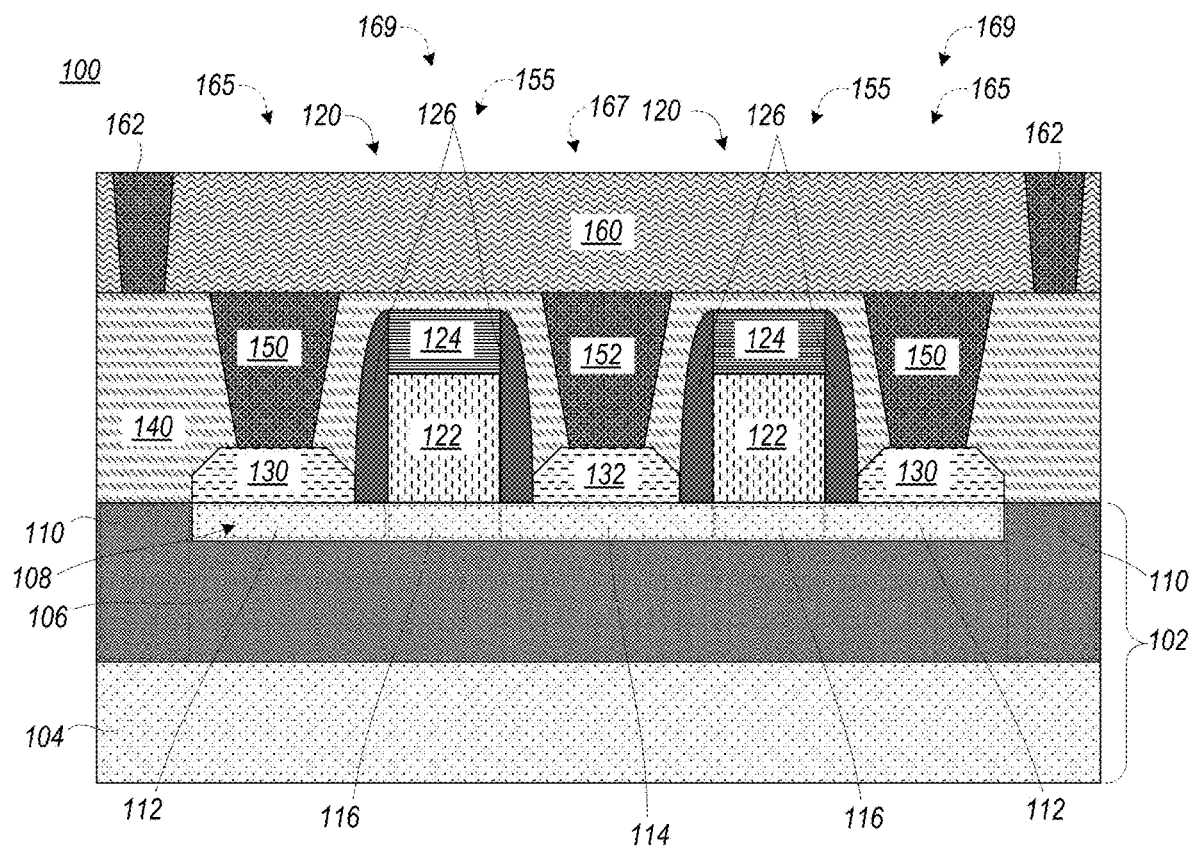
FIG. 1 depicts a cross-sectional view of a semiconductor device shown after respective fabrication operations, in accordance with one or more embodiments.

As the size of metal oxide semiconductor field effect transistors (MOSFETs) and other devices decrease, the dimensions of source/drain regions, channel regions, and electrodes of the devices, also generally decrease. The design of ever-smaller transistors with short channel lengths makes it necessary to provide very shallow source/drain junctions. Shallow junctions are needed to avoid lateral diffusion of implanted dopants into the channel, since such diffusion disadvantageously contributes to leakage currents and poor breakdown performance. Shallow source/drain junctions, with a thickness of about 30 nm to 100 nm, are generally required for acceptable performance in short channel devices. Silicon-on-insulator (SOI) technology allows the formation of high-speed, shallow junction devices. In addition, SOI devices improve performance by reducing parasitic junction capacitance.

It is understood in advance that although a detailed description is provided herein of an exemplary fully-depleted silicon-on-insulator (FDSOI) semiconductor IC device that includes a FET vertically stacked upon a second lower IC device, implementation of the teachings recited herein are not limited to the particular device architecture described herein. Rather, embodiments of the present invention are capable of being implemented in conjunction with any other appropriate type of SOI semiconductor IC device vertically stacked upon a second lower IC device.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semi-conductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. For example, materials may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.). Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

FIG. 1 is a cross-sectional view of semiconductor device 100 that includes an SOI substrate 102, in accordance with an embodiment of the present invention.

SOI substrate 102 includes a semiconductor substrate 104, a buried insulator 106 upon the semiconductor substrate 104, and a semiconductor layer 108 upon the buried insulator 106. The buried insulator 106 is formed directly on the semiconductor substrate 104. The buried insulator 106 may be formed of silicon nitride (SiN), silicon oxide ($SiO_2$), or the like. The semiconductor layer 108 may be an extremely thin semiconductor-on-insulator (ETSOI) layer 108 formed over the buried insulator 106. Semiconductor layer 108, ETSOI layer 108, or the like may be referred herein as a residual SOI layer. The term "residual SOI layer" is defined herein to be a layer of an SOI substrate that is retained with one or more of the other layer(s) of the SOI substrate being removed.

In one or more embodiments, the substrate 104 can be a semiconductor or an insulator with an active surface semiconductor layer. The substrate 104 can be crystalline, semi-crystalline, microcrystalline, or amorphous. The substrate 104 can be essentially (i.e., except for contaminants) a single element (e.g., silicon), primarily (i.e., with doping) of a single element, for example, silicon (Si) or germanium (Ge), or the substrate 104 can include a compound, for example, $Al_2O_3$, $SiO_2$, GaAs, SiC, or SiGe. The substrate 104 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 104 can also have other layers forming the substrate 104, including high-k oxides and/or nitrides. In one or more embodiments, the substrate 104 can be a silicon wafer. In an embodiment, the substrate 104 is a single crystal silicon wafer.

The ETSOI layer 108 can comprise any semiconducting material including, but not limited to Si, strained Si, SiC, SiGe, SiGeC, Si alloys, Ge, Ge alloys, GaAs, InAs, and InP, or any combination thereof. The ETSOI layer 108 can be thinned to a desired thickness by planarization, grinding, wet etch, dry etch, oxidation followed by oxide etch, or any combination thereof. One method of thinning the ETSOI layer 108 is to oxidize the Si by a thermal dry or wet oxidation process, and then wet etch the oxide layer using a hydrofluoric acid mixture. This process can be repeated to achieve the desired thickness. In one embodiment, the ETSOI layer 108 can have a thickness ranging from 1.0 nm to 25.0 nm. In another embodiment, the ETSOI layer 108 can have a thickness ranging from 5.0 nm to 15.0 nm. In a further embodiment, the ETSOI layer 108 can have a thickness ranging from 6.0 nm to 10.0 nm. The term "ETSOI substrate" is defined herein as a semiconductor on insulator (SOI) substrate, in which the semiconductor on insulator (SOI) layer (e.g., layer 108) has a thickness of 25 nm or less.

A dummy gate (not shown) with sidewall spacers 126 may be formed over an ETSOI channel region 116. Raised source/drain region 130 and raised drain/source region 132 may be formed upon an associated ETSOI source/drain region 112 and an associated ETSOI drain/source region 114. The raised source/drain region 130 and the raised drain/source region 132 may be formed next to the dummy gate, in accordance with an embodiment of the present invention.

In various embodiments, semiconductor device 100 fabrication can be followed by forming isolation 110 (e.g., shallow trench isolation (STI)), forming a dummy gate (not shown), forming sidewall spacers 126 on opposed ends of the dummy gate, forming ETSOI source/drain region 112, forming ETSOI drain/source region 114, forming raised source/drain region 130, and forming raised drain/source region 132.

ETSOI channel region 116 can be formed between ETSOI source/drain region 112 and ETSOI drain/source region 114. Additionally, the dummy gate can rest on a dummy gate oxide (not shown) that may be formed over the ETSOI channel region 116. The dummy gate oxide may be further positioned between bottom portions of the spacers 126. The dummy gate has a thickness greater than the thickness of the dummy gate oxide. The ETSOI channel region 116 has a thickness approximately equal to the thickness of the ETSOI source/drain region 112 and ETSOI drain/source region 114. The raised source/drain region 130 and the raised drain/source region 132 may have a thickness greater than the thickness of the ETSOI source/drain region 112 and ETSOI drain/source region 114, respectively.

Isolation regions 110 are formed by etching a trench in the substrate 102 utilizing a conventional dry etching process such as RIE or plasma etching. The trenches can optionally be lined with a conventional liner material, e.g., silicon nitride or silicon oxynitride, and then CVD or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

In various embodiments, the dummy gate may be formed by forming a dummy gate layer followed by patterning. The dummy gate can comprise a stack of materials, such as a dummy gate dielectric (e.g., silicon oxide), amorphous silicon, a dielectric cap (e.g., silicon nitride). Later in the process sequence, the dummy gate is removed, and replaced with a functional gate structure that have one or more gate dielectrics and the at least one gate conductor. The dummy gate has a thickness that is greater than the thickness of the raised source/drain region 130 and the raised drain/source region 132. The top surface of the dummy gate can be coplanar with the top surface of the spacers 126.

The spacers 126 can be formed by deposition followed by a directional etch (e.g., RIE). Spacers 126 can be formed along the sidewalls of the dummy gate. For example, spacer material such as a nitride (e.g., silicon nitride) can be deposited in a conventional manner, such as by chemical vapor deposition (CVD) or atomic layer deposition (ALD). Other techniques, which can be suitable for deposition of a nitride layer, include low-pressure CVD (LPCVD) and atmospheric pressure (CVD) (APCVD). Portions of the deposited nitride layer are subsequently etched away in a conventional manner to form the spacers 126. Spacer material can be silicon oxide, silicon oxynitride, silicon nitride, SiBCN, SiOCN, SiOC, or any suitable combination of those materials.

The dummy gate and the spacers 126 may be formed before the ETSOI source/drain region 112 and ETSOI drain/source region 114. In various embodiments, the ETSOI source/drain region 112 and the ETSOI drain/source region 114 may be formed by doping the applicable ETSOI layer 108 region with the appropriate N-type or P-type dopant, The dopant can be provided to the ETSOI source/drain region 112 and the ETSOI drain/source region 114 by ion implantation. Subsequently, the ETSOI source/drain region 112 and the ETSOI drain/source region 114 may be annealed. In various embodiments, the doped ETSOI source/drain region 112 and the doped ETSOI drain/source region 114 can be n-doped or p-doped.

In various embodiments, the doped regions 112, 114 can be doped in-situ or ex-situ, for example, through ion implantation or thermal diffusion of dopants into the ETSOI layer 108. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming raised source/drain region 130 and the raised drain/source region 132 can include forming an in situ doped epitaxial semiconductor material over the doped regions 112, 114. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 112, 114 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material upon the source and drain regions 112, 114.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition can result in crystal defects and film cracking.

The epitaxial semiconductor material that provides the raised source/drain region 130 and the raised drain/source region 132 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane (B2H6).

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

The term "raised" as used to describe the raised source/drain region 130 and the raised drain/source region 132 means that the lower surface of the raised source and drain regions 130, 132 is in direct physical contact with the surface of the ETSOI substrate 108. The raised source and drain regions 130, 132 can be formed using a selective epitaxial growth process. The fact that the process is selective means that the deposited semiconductor material grows only on exposed semiconductor regions and does not grow on a dielectric, such as silicon oxide. The epitaxial growth process can be continued until the raised source and drain regions 130, 132 have a height ranging from 5 nm to 50 nm, as measured from the upper surface of the ETSOI substrate 108. Typically, the raised source and drain regions 130, 132 are composed of a silicon containing material, such as silicon, silicon germanium, or silicon doped with carbon (Si:C).

However, a number of different sources can be used for the deposition of the semiconductor material that forms the raised source and drain regions 130, 132. In some embodiments, in which the semiconductor material that forms the raised source/drain regions 130, 132 is composed of silicon, the silicon gas source for epitaxial deposition can be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the semiconductor material that forms the raised source/drain regions 130, 132 is composed of germanium, the germanium gas source for epitaxial deposition can be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material that forms the raised source/drain region 130, 132 is composed of silicon germanium, the silicon sources for epitaxial deposition can be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources can be selected from the group consisting of germane, digermane, halogermane, dichlorogermane, trichlorogermane, tetrachlorogermane and combinations thereof.

In various embodiments, semiconductor device 100 fabrication can be followed by forming an interlevel dielectric (ILD) layer 140 over the raised source/drain regions 130, 132 and the dummy gate is removed to define a recess. The ILD 140 may have a dielectric liner (e.g., silicon nitride) and a filling dielectric material (e.g., silicon oxide).

In various embodiments, ILD 140 oxide fill takes place. The ILD 140 may be planarized. The ILD 140 encompasses or envelopes or surrounds the entire raised source/drain regions 130, 132. The ILD 140 engages an outer surface of the sidewall spacers 126. In one example embodiment, the ILD 140 extends to a top point of the spacers 126. Stated differently, the ILD 140 is flush with the distal end of the spacers 126. Alternatively, as depicted ILD 140 may have a thickness greater than the height of spacers 126. Additionally, the dummy gate may be removed, and a gap or recess is presented between the inner sidewalls of spacers 126.

In one or more embodiments, the ILD 140 can have a thickness in the range of about 20 nm to about 150 nm, or in the range of about 30 nm to about 50 nm.

The ILD 140 can be selected from the group consisting of silicon containing materials such as $SiO_2$, $Si_3N_4$, SiOxNy, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 140 include any of the aforementioned materials in porous form, or in a form that changes during processing to or from being porous and/or permeable to being non-porous and/or non-permeable.

In various embodiments, the height of the ILD 140 can be selectively reduced by chemical-mechanical polishing (CMP) and/or etching. Therefore, the planarization process can be provided by CMP. Other planarization process can include grinding and polishing.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

In various embodiments, semiconductor device 100 fabrication can be followed by forming replacement gate structure 120 within the recess formed by the removal of the dummy gate, in accordance with an embodiment of the present invention.

In various embodiments, the newly formed gate structure 120 includes a gate dielectric (not shown), gate conductor 122, and gate cap 124 that are deposited within the recess. The gate dielectric may contact the inner surface of the sidewall spacers 126 and a portion of the upper surface of semiconductor layer 108. The gate conductor 122 may be subsequently filled within the gate dielectric. The gate conductor 122 may be formed by deposition followed by planarization (e.g., CMP) so that it is flush or below the top surface of the gate spacers 126.

The gate conductor 122 can be any conductive metal including, but not limited to W, Ni, Ti, Mo, Ta, Cu, Pt, Ag, Au, Ru, Jr, Rh, and Re, and alloys that include at least one of the aforementioned conductive elemental metals. The gate conductor 122 is typically present on the gate dielectric. The gate dielectric can be a dielectric material, such as SiO2, SiN, BNi, or alternatively high-k dielectrics, such as oxides of Ta, Zr, Al or combinations thereof. In another embodiment, the gate dielectric can be comprised of an oxide, such as $ZrO_2$, $Ta_2O_5$ or $Al_2O_3$. In one embodiment, the gate dielectric has a thickness ranging from 1 nm to 10 nm. In another embodiment, the gate dielectric has a thickness ranging from 1.5 nm to 2.5 nm. In a preferred embodiment, the gate dielectric is a high-k material (a material with a high dielectric constant (κ, kappa), as compared to silicon dioxide). Further examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The gate conductor 122 can be doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The gate conductor 122 may further comprise dopants that are incorporated during or after deposition.

The gate structure 120 can further comprise a gate workfunction setting layer (not shown) between the gate dielectric and the gate conductor 122. The gate workfunction setting layer can be a metallic compound, including but not limited to: but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

The gate structure 120 can further include gate cap 124. Gate cap 124 may be formed upon the gate conductor 122. The gate cap 124 may be a hard mask, or the like. Exemplary gate cap 124 materials may be SiN, $SiO_2$, a combination of SiN and $SiO_2$, SiON, SICN, SIOCN, or the like. The gate cap 124 may be formed by known deposition techniques such PVD, CVD, ALD, or the like. The gate cap 124 material can have a thickness of from about 1 nm to about 200 nm, although other thicknesses are within the contemplated scope.

The gate structure 120 functions to switch the semiconductor device 100 from an on to off state, and vice versa. The gate structure 120 may be formed in alignment with the ETSOI channel 116. The gate structure 120 typically includes at least a gate dielectric that is also aligned with the ETSOI channel 116.

The gate structure 120 may be planarized (e.g., CMP) so that it is flush with the top surface of the ILD 140.

In various embodiments, semiconductor device 100 fabrication can be followed by forming contacts 150, 152, 155 over the raised source/drain region 130, the raised drain/source region 132, and the gate structure 120, respectively, and by forming middle of the line (MOL) and/or back end of the line (BEOL) layer(s) 160, hereinafter referred to metallization layer(s) 160, in accordance with an embodiment of the present invention.

Contacts 150, 152 may be formed within the ILD 140. Contact 150 may be formed over and be in physical contact with the raised source/drain region 130. The contact 152 may be formed over and be in physical contact with the raised drain/source region 132. The contact 155 (not shown) may be formed over and be in physical contact with the gate structure 120.

Metallization layer(s) 160 may be deposited over the top surface of the contacts 150, 152, 155 and over the top surface of the ILD 140. The thickness of the metallization layer(s) 160 can be greater than the thickness of the ETSOI layer 108.

Concerning metallization layer(s) 160, a layer of dielectric material may be blanket deposited atop the entire substrate and planarized. The blanket dielectric can be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the blanket dielectric include: any of the aforementioned materials in porous form, or in a form that changes during processing to or from being porous and/or permeable to being non-porous and/or non-permeable.

The blanket dielectric can be formed by various methods well known to those skilled in the art, including, but not limited to spinning from solution, spraying from solution, CVD, PECVD, sputter deposition, reactive sputter deposition, ion-beam deposition, and evaporation.

The deposited blanket dielectric may then patterned and etched to form holes or openings to the various contacts 150, 152, 155 and/or to other conductive wiring features there below. Following via formation, conductive interconnects 162, 165 (not shown), 167 (not shown), 169 (not shown) are formed by depositing a conductive metal into the via holes using conventional processing, such as CVD or plating. The conductive metal can include, but is not limited to: tungsten, copper, aluminum, silver, gold, and alloys thereof. The BEOL layer can comprise one or multiple stacks of wires/vias may form the interconnects 162, 165, 167, and/or 169. Conductive interconnect 162 may be formed over and be physically connected with a conductive wiring feature there below. Conductive interconnect 165 may be formed over and be physically connected with the contact 150 there below. Conductive interconnect 167 may be formed over and be physically connected with the contact 152 there below. Conductive interconnect 169 may be formed over and be physically connected with the contact 155 there below.

Figure 2:
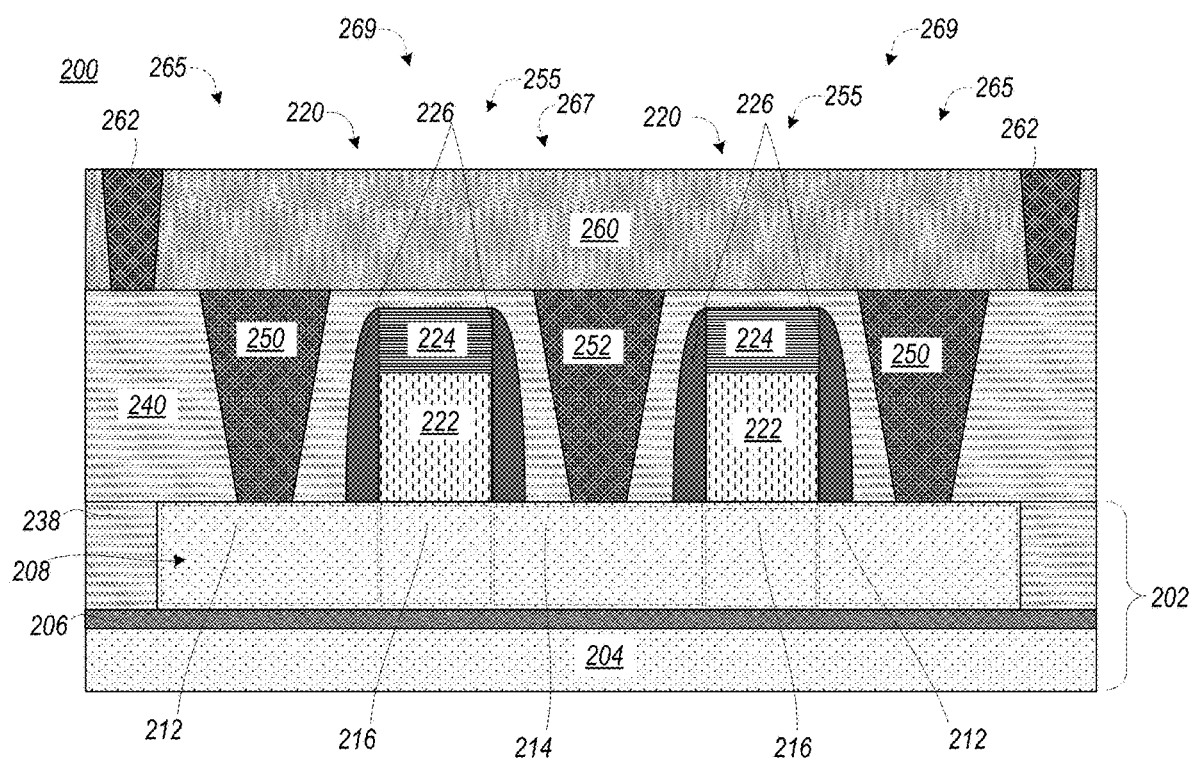
FIG. 2 depicts a cross-sectional view of a semiconductor device shown after respective fabrication operations, in accordance with one or more embodiments.

FIG. 2 is a cross-sectional view of semiconductor device 200, in accordance with an embodiment of the present invention.

Semiconductor device 200 may generally be a wafer, carrier, interposer, or the like. In some embodiments, semiconductor device 200 may be a semiconductor device that includes one or more FETs (e.g., finFETs, nanowire FETs, nanosheet FETs, gate all around FETs, etc.).

As is further described herein, semiconductor device 100 may be stacked and bonded to the semiconductor device 200 to form stacked semiconductor device 299. A stacked integrated circuit (e.g., 3D IC) is an integrated circuit manufactured by stacking silicon wafers and/or dies and interconnecting them vertically using e.g., through silicon vias (TSVs) so that they behave as a single device to achieve performance improvements at reduced power and smaller footprint than conventional two dimensional processes. 3D IC is just one of a host of 3D integration schemes that exploit the z-direction to achieve electrical performance benefits. 3D semiconductor and packaging technology using through-silicon-vias (TSVs) are used to stack thinned semiconductor chips and to integrate heterogeneous semiconductor technologies into micro-electronic modules.

An exemplary semiconductor device 200 that includes a SOI substrate 202 is depicted and described herein. SOI substrate 202 includes a semiconductor substrate 204, a buried insulator 206 upon the semiconductor substrate 204, and a semiconductor layer 208 upon the buried insulator 206. The buried insulator 206 may be formed directly on the semiconductor substrate 204. The semiconductor layer 208 may be formed directly on the buried insulator 206.

In one or more embodiments, the substrate 204 be the same type of substrate as substrate 104 and description thereof is not repeated herein. Similarly, buried insulator 206 may be the same or similar type of layer as buried insulator 106 and description thereof is not repeated herein. Likewise, semiconductor layer 208 may be the same or similar type of layer as ETSOI layer 108 and description thereof is not repeated herein. In embodiments, such as the finFET embodiment depicted, the thickness of semiconductor layer 208 may be greater than the thickness of ETSOI layer 108. One or more fins may be formed by removing portions of semiconductor layer 208 and retaining other portions of semiconductor layer 208. The retained portions of semiconductor layer 208 may form the fins.

In various embodiments, semiconductor device 200 fabrication can be followed by forming a dummy gate (not shown), forming sidewall spacers 226 on opposed ends of the dummy gate, forming a fin source/drain region 212, forming a fin drain/source region 214, and forming a fin channel region 216.

The fin channel region 216 can be formed between the fin source/drain region 212 and the fin drain/source region 214. Additionally, the dummy gate can rest on a dummy gate oxide (not shown) that may be formed over the fin channel region 216. The dummy gate oxide may be further positioned between bottom portions of the spacers 226. The dummy gate has a thickness greater than the thickness of the dummy gate oxide.

In various embodiments, the dummy gate may be formed by forming a dummy gate layer followed by patterning. The dummy gate can comprise a stack of materials, such as a dummy gate dielectric (e.g., silicon oxide), amorphous silicon, a dielectric cap (e.g., silicon nitride). Later in the process sequence, the dummy gate is removed, and replaced with a functional gate structure that have one or more gate dielectrics and the at least one gate conductor. The dummy gate has a thickness that is greater than the thickness of the raised the fin. The top surface of the dummy gate can be coplanar with the top surface of the spacers 226.

The spacers 226 can be formed by deposition followed by a directional etch (e.g., RIE). Spacers 226 can be formed along the sidewalls of the dummy gate. For example, spacer material such as a nitride (e.g., silicon nitride) can be deposited in a conventional manner, such as by chemical vapor deposition (CVD) or atomic layer deposition (ALD). Other techniques, which can be suitable for deposition of a nitride layer, include low-pressure CVD (LPCVD) and atmospheric pressure (CVD) (APCVD). Portions of the deposited nitride layer are subsequently etched away in a conventional manner to form the spacers 226. Spacer material can be silicon oxide, silicon oxynitride, silicon nitride, SiBCN, SiOCN, SiOC, or any suitable combination of those materials.

The dummy gate and the spacers 226 may be formed before fin source/drain region 212, the fin drain/source region 214, and the fin channel region 116. The fin source/drain region 212 and the fin drain/source region 214 may be formed my doping the applicable fin region with the appropriate N-type or P-type dopant, The dopant can be provided to the fin region by ion implantation. Subsequently, fin source/drain region 212 and the fin drain/source region 214 may be annealed. In various embodiments, the doped fin source/drain region 212 and the fin drain/source region 214 can be n-doped or p-doped.

In various embodiments, the doped regions 212, 214 can be doped in-situ or ex-situ, for example, through ion implantation or thermal diffusion of dopants into the fin. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

In various embodiments, semiconductor device 200 fabrication can be followed by forming ILD layer 238, 240 and removing the dummy gate to define a recess. The ILD 238, 240 may have a dielectric liner (e.g., silicon nitride) and a filling dielectric material (e.g., silicon oxide).

In various embodiments, ILD 238, 240 oxide fill takes place. The ILD 238, 240 may be planarized. The ILD 238 encompasses or envelopes or surrounds the entire fin and/or dummy gate structure. The ILD 240 encompasses or envelopes or surrounds the entire dummy gate structure. The ILD 240 engages an outer surface of the sidewall spacers 226. In one example embodiment, the ILD 240 extends to a top point of the spacers 226. Stated differently, the ILD 240 is flush with the distal end of the spacers 226. Alternatively, as depicted ILD 240 may have a thickness greater than the height of spacers 226. Additionally, the dummy gate may be removed, and a gap or recess is presented between the inner sidewalls of spacers 226.

In one or more embodiments, the ILD 240 can have a thickness in the range of about 20 nm to about 150 nm, or in the range of about 30 nm to about 50 nm. The ILD 238, 240 may be the same type of material as ILD 240 and description thereof is not repeated herein. In various embodiments, the height of the ILD 240 can be selectively reduced by CMP and/or etching. Other planarization process can include grinding and polishing.

In various embodiments, semiconductor device 200 fabrication can be followed by forming replacement gate structure 220 within the recess formed by the removal of the dummy gate, in accordance with an embodiment of the present invention. The formation and materials of replacement gate structure 220 may be the same as the respective materials of replacement gate structure 120 and descriptions thereof are not repeated herein.

The gate structure 220 functions to switch the semiconductor device 200 from an on to off state, and vice versa. The gate structure 220 may be formed in alignment with the fin channel region 216. The gate structure 220 typically includes at least a gate dielectric that is also aligned with the fin channel region 216. The gate structure 220 may be planarized (e.g., CMP) so that it is flush with the top surface of the ILD 240.

In various embodiments, semiconductor device 200 fabrication can be followed by forming contacts 250, 252, 255 over the fin source/drain region 212, the fin drain/source region 214, and the gate structure 220, respectively, and by forming middle of the line (MOL) and/or back end of the line (BEOL) layer(s) 260, hereinafter referred to metallization layer(s) 260, in accordance with an embodiment of the present invention.

Contacts 250, 252, 255 may be formed within the ILD 240. Contact 250 may be formed over and be in physical contact with the fin source/drain region 212. The contact 252 may be formed over and be in physical contact with the fin drain/source region 214. The contact 255 (not shown) may be formed over and be in physical contact with the gate structure 220.

Metallization layer(s) 260 may be deposited over the top surface of the contacts 250, 252, 255 and over the top surface of the ILD 240. The thickness of the metallization layer(s) 260 can be greater than the thickness of the semiconductor layer 208.

Concerning metallization layer(s) 260, a layer of dielectric material may be blanket deposited atop the entire substrate and planarized. The blanket dielectric can be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the blanket dielectric include: any of the aforementioned materials in porous form, or in a form that changes during processing to or from being porous and/or permeable to being non-porous and/or non-permeable.

The blanket dielectric can be formed by various methods well known to those skilled in the art, including, but not limited to spinning from solution, spraying from solution, CVD, PECVD, sputter deposition, reactive sputter deposition, ion-beam deposition, and evaporation.

The deposited blanket dielectric may then patterned and etched to form holes or openings to the various contacts 250, 252, 255 and/or to other conductive wiring features there below. Following via formation, conductive interconnects 262, 265 (not shown), 267 (not shown), 269 (not shown) are formed by depositing a conductive metal into the via holes using conventional processing, such as CVD or plating. The conductive metal can include, but is not limited to: tungsten, copper, aluminum, silver, gold, and alloys thereof. The metallization layer 260 can comprise one or multiple stacks of wires/vias may form the interconnects 262, 265, 267, and/or 269. Conductive interconnect 262 may be formed over and be physically connected with a conductive wiring feature there below. Conductive interconnect 265 may be formed over and be physically connected with the contact 250 there below. Conductive interconnect 267 may be formed over and be physically connected with the contact 252 there below. Conductive interconnect 269 may be formed over and be physically connected with the contact 255 there below.

Figure 3:
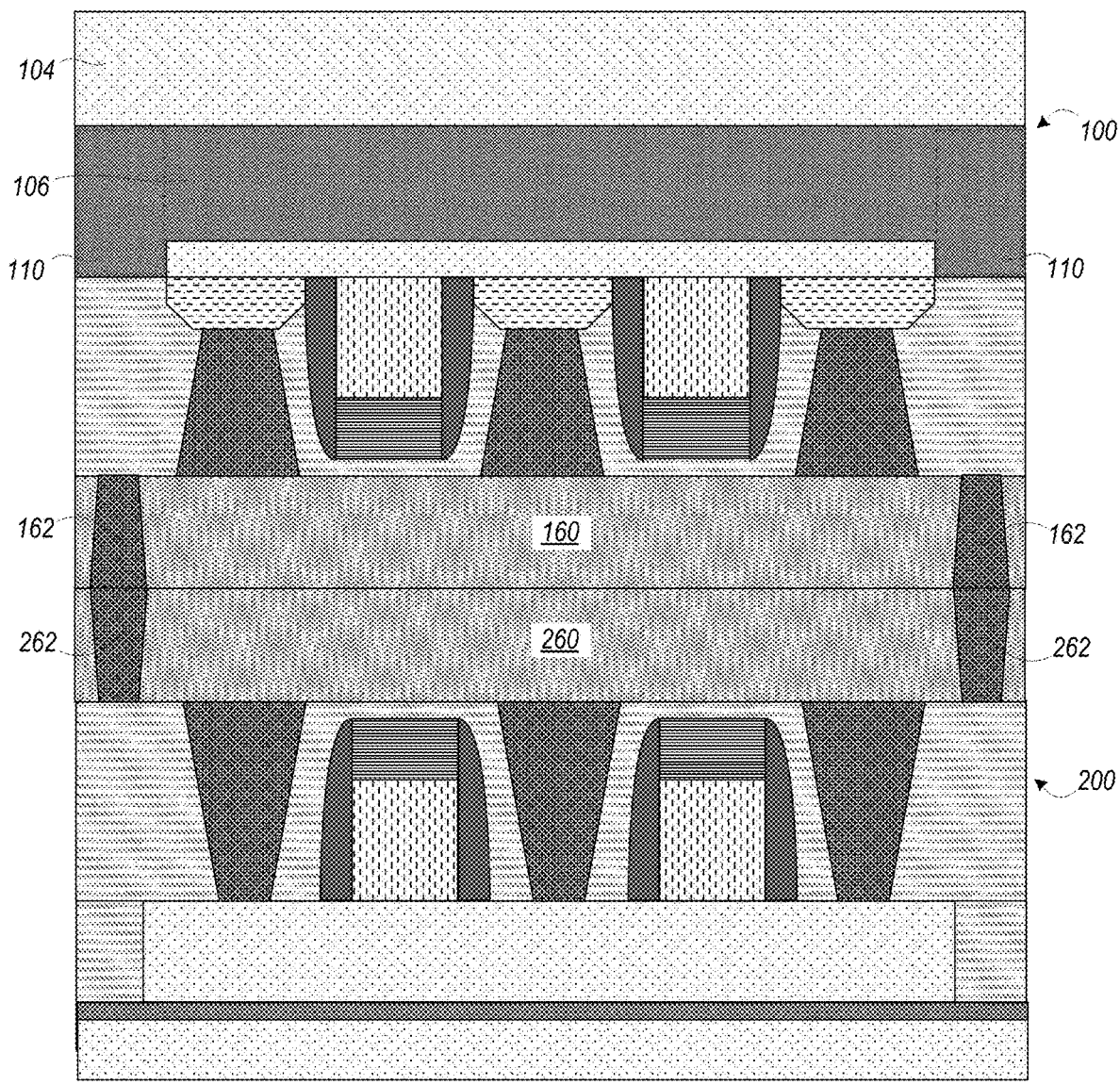
FIG. 3 through FIG. 6 depict cross-sectional views of a stacked semiconductor device shown after respective fabrication operations, in accordance with one or more embodiments.

FIG. 3 depicts cross-sectional views of stacked semiconductor device 299 shown after respective fabrication operations, in accordance with one or more embodiments. At the present fabrication stage, semiconductor device 100 is stacked and bonded to semiconductor device 200 to form stacked semiconductor device 299.

The semiconductor device 100 may be vertically stacked and bonded to the semiconductor device 200 at the wafer level. The semiconductor device 100 may be flipped or orientated with respect to semiconductor device 200 such at a backside (i.e., semiconductor substrate 104) of semiconductor device 100 faces upward, as depicted.

Semiconductor device 100 may be stacked and bonded upon semiconductor device 200 by known 3D or stacked IC device integration schemes that exploit the z-direction to achieve electrical performance benefits. For example, interconnects 162 and interconnects 262 may be TSVs and may be physically and electrically connected by known bonding materials, such as solder, or the like. One or more adhesive layer(s) may further bond the top surface of semiconductor device 100 with the top surface of semiconductor device 200. For example, an adhesive layer (not shown) may bond metallization layer 160 with metallization layer 260.

Figure 4:
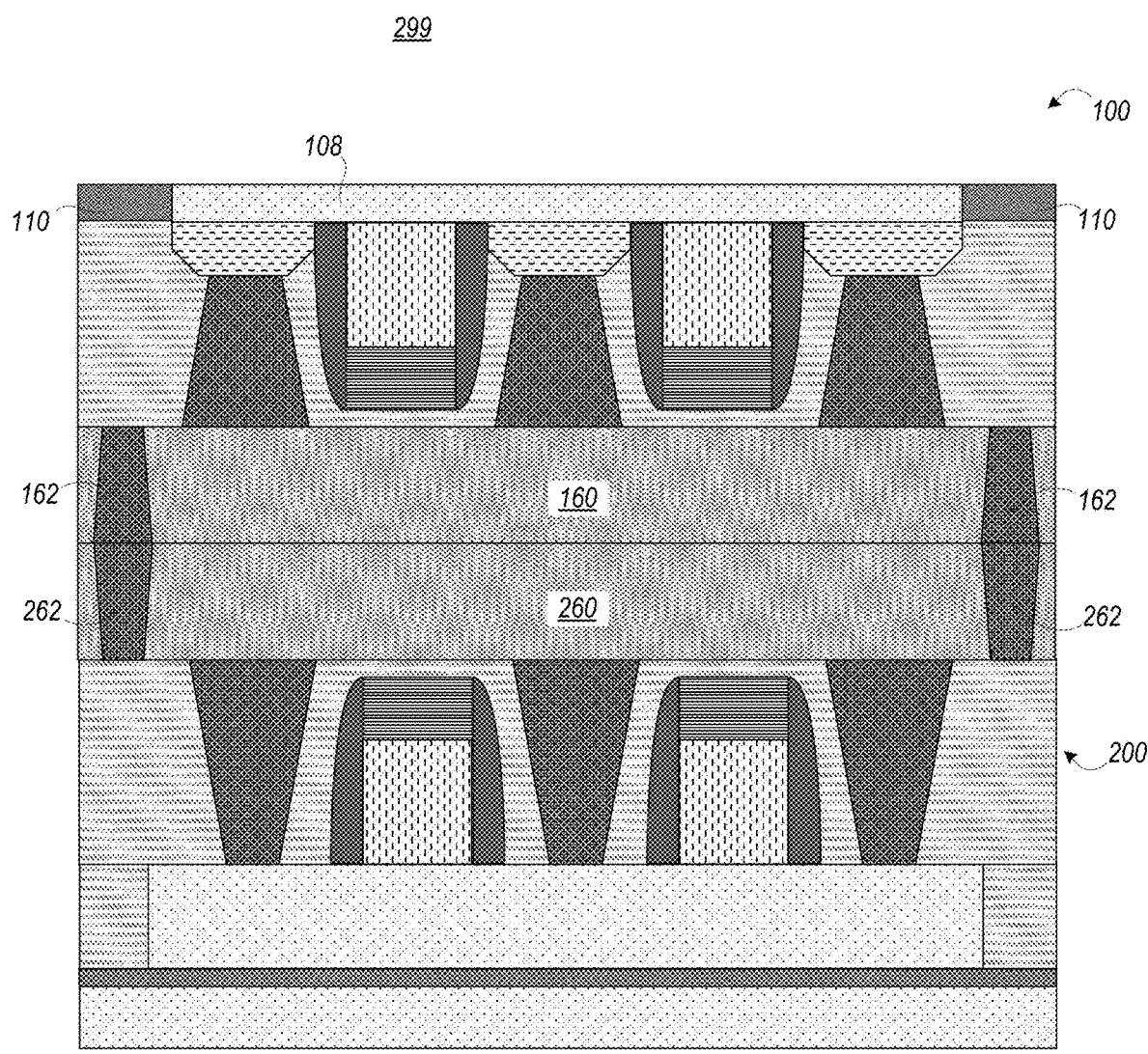

FIG. 4 depicts cross-sectional views of stacked semiconductor device 299 shown after respective fabrication operations, in accordance with one or more embodiments. At the present fabrication stage, a backside of ETSOI layer 108 is exposed.

The backside of ETSOI layer 108 may be exposed by selectively removing semiconductor substrate 104 and at least partially selectively removing buried insulator 106 while retaining the semiconductor structure 100 materials below the backside of ETSOI layer 108, as depicted. For example, semiconductor substrate 104 is selectively etched away and other semiconductor structure 100 material(s) there below are retained. Subsequently in a different etching stage, buried insulator 106 is selectively etched away and isolation region(s) 110 and ETSOI layer 108 and other semiconductor structure 100 material(s) there below are retained.

Figure 5:
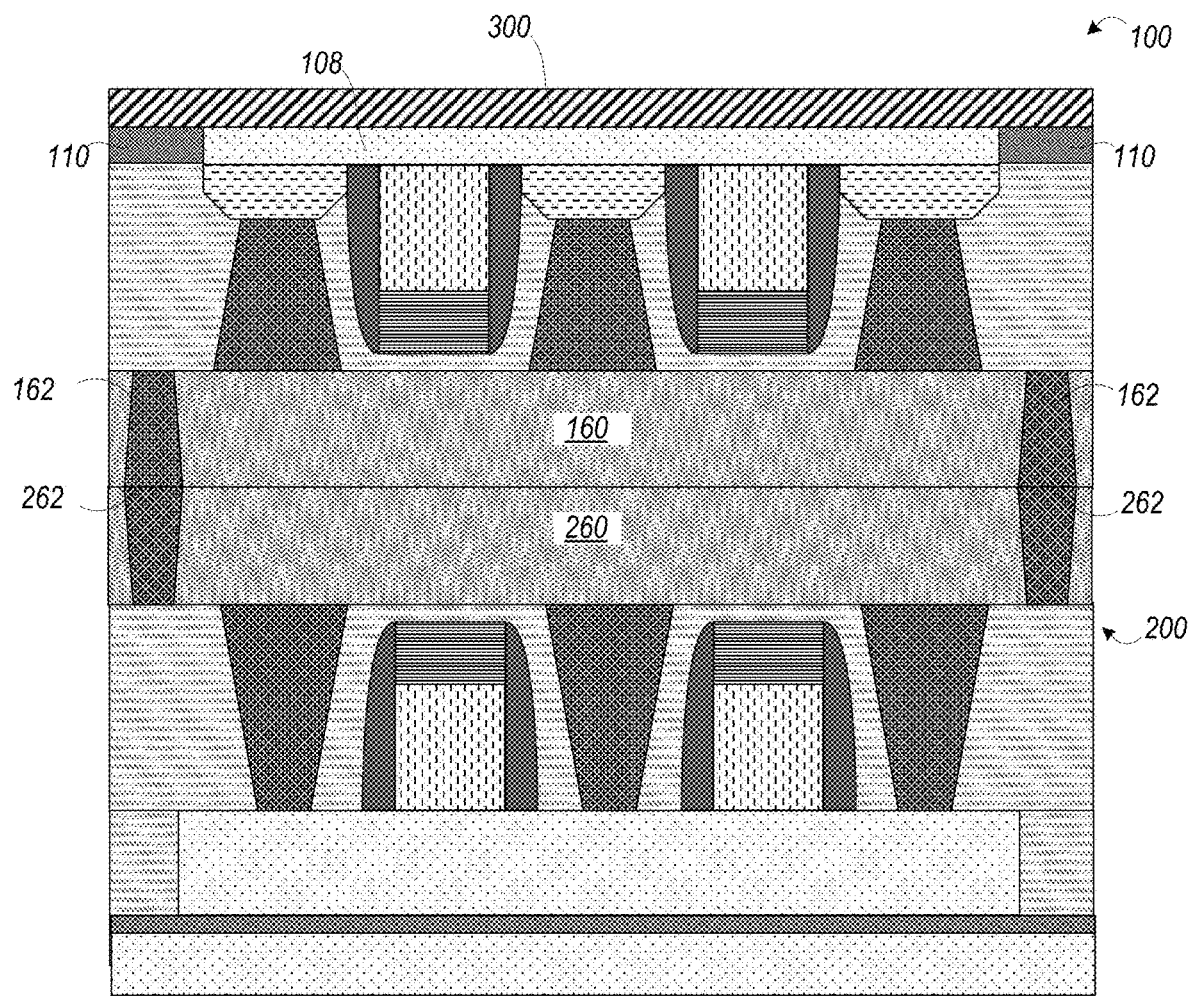

FIG. 5 depicts cross-sectional views of stacked semiconductor device 299 shown after respective fabrication operations, in accordance with one or more embodiments. At the present fabrication stage, a stressed layer 300 is formed upon the exposed backside of ETSOI layer 108.

Stressed layer 300 may be formed by depositing a dielectric material upon isolation region(s) 110 and/or ETSOI layer 108. Stressed layer 300 can have a thickness of from about 10 nm to about 200 nm. Exemplary stressed layer material may be but are not limited to: SiN, SiC, SiON, SiOC, SiCN, BN, SiBN, SiBCN, SiOCN, $SiO_x$, a replacement metal upon a liner as an insulator, combinations thereof, etc. Further, stressed layer 300 can be a low-k material.

After formation of stressed layer 300, excessive stressed layer 300 material can be removed by an etching or polish process, such as a CMP. Removal of the excess stressed layer 300 material can be accomplished using, for example, a selective wet etch process, or a selective dry etch process, or other subtractive removal technique, as is known in the art.

Stressed layer 300 has an internal or intrinsic tension or stress, such that there is an internally generated tensile stress or an internally generated compressive stress, as appropriate.

A compressive force may result by previously generating an internal tensile stress by spacing constituent atoms of stressed layer 300 further apart with respect each other than in their equilibrium positions. Subsequently, such material wants to shrink (to get back to the equilibrium) creating a pulling, inward force (e.g., laterally toward the center of the page) within stressed layer 300. Similarly, internal compressive stress may result by previously generating an internal compressive stress by spacing constituent atoms of stressed layer 300 closer together with respect each other than in their equilibrium positions. Subsequently, such material wants to expand (to get back to the equilibrium) creating a pulling, outward force (e.g., laterally toward the left-right sides of the page) within stressed layer 300.

When stressed layer 300 has an earlier internal tensile stress, the resulting stressed layer 300 shrinks the underlying ETSOI layer 108 laterally toward the center of the page. This, in turn, will space atoms within the ETSOI layer 108 closer together. As such, the stressed layer 300 may create or result in an intrinsic pulling inward compressive stress within ETSOI layer 108 laterally toward the center of the page. This resulting compressive stress within ETSOI layer 108 may improve hole mobility therewithin. Specifically, the resulting intrinsic compressive stress within ETSOI layer 108 may improve hole mobility through channel region 116 within p-type FETs.

When stressed layer 300 has an earlier internal compressive stress, the resulting stressed layer 300 pulls the underlying ETSOI layer 108 laterally toward the left-right sides of the page. This, in turn, will space atoms within the ETSOI layer 108 further apart. As such, the stressed layer 300 may create or result in an intrinsic pulling outward tensile stress within ETSOI layer 108 laterally toward the left-right sides of the page. This resulting tensile stress within ETSOI layer 108 may improve electron mobility therewithin. Specifically, the resulting intrinsic tensile stress within ETSOI layer 108 may improve electron mobility through channel region 116 within n-type FETs.

Stressed layer 300 may be formed by plasma enhanced chemical vapor deposition (PECVD), or the like, such that respective process parameters, such as composition of carrier gases and reactive gases, substrate temperature, deposition pressure and, in particular, ion bombardment during the deposition, may significantly influence the finally obtained intrinsic stress of stressed layer 300.

High level of intrinsic tensile stress in the stressed layer 300 can be produced by an annealing or curing step that induces shrinkage of stressed layer 300 material which results in subsequent tensile expansion (to get back to equilibrium). This additional step can be conducted immediately after stressed layer 300 material deposition or later in the process flow. In one example, such additional annealing or curing step detaches hydrogen from within the stressed layer 300 material, producing shrunk chemical bonds within, that resultantly yield a high level of tensile intrinsic stress. For example, when stressed layer 300 is deposited and annealed, a high intrinsic tensile stress of up to 2 GPa or even significantly higher may be achieved by e.g., detaching hydrogen during or after deposition or, alternatively, reducing ion bombardment by establishing the deposition atmosphere with a low level of radio frequency (RF) power so as to obtain the desired internally generated tensile force.

Figure 6:
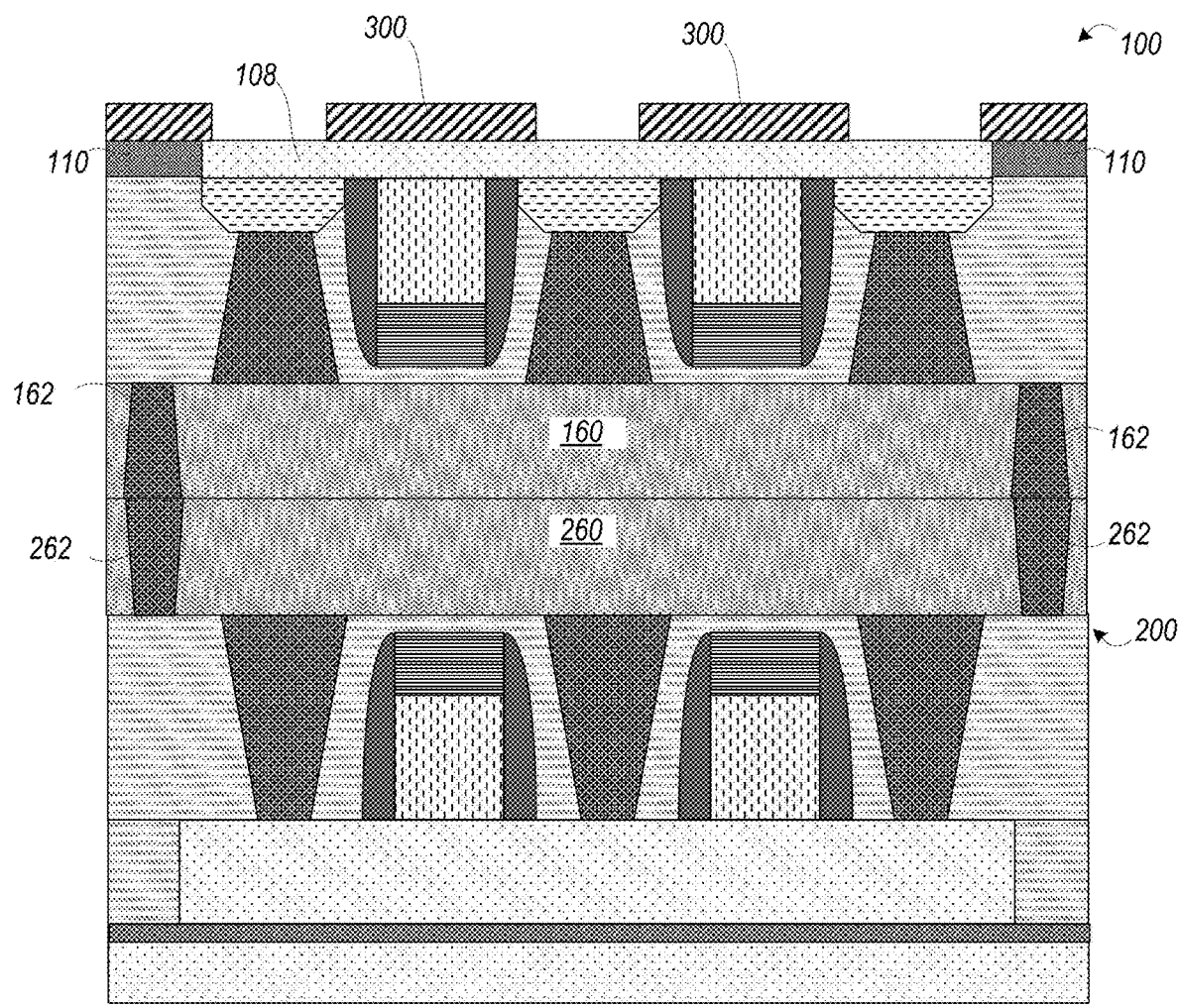

FIG. 6 depicts cross-sectional views of stacked semiconductor device 299 shown after respective fabrication operations, in accordance with one or more embodiments. At the present fabrication stage, stressed layer 300 is patterned whereby portions of the stressed layer 300 are removed while other portions of the stress layer 300 are retained.

The patterned stressed layer 300 may be formed by known patterning and etching techniques, such as forming a mask (not shown) upon the stressed layer 300 patterning the mask and etching or removing the undesired portions of the stressed layer 300 through the patterned mask. The removal of portion of the stress layer 300 may expose the underlying materials of the semiconductor device 100 (e.g., ETSOI layer 108, isolation 110, or the like).

Figure 7:
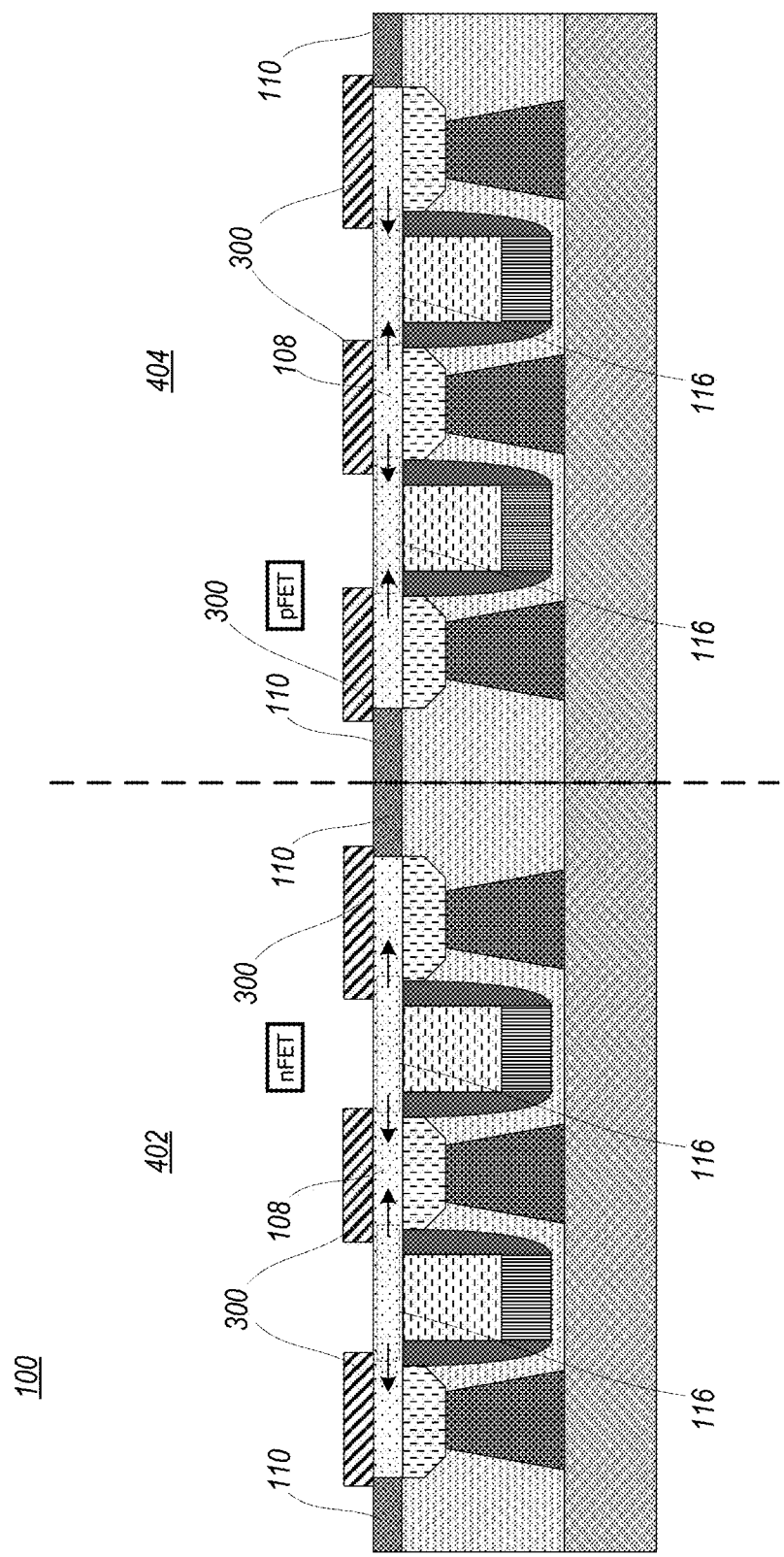
FIG. 7 and FIG. 8 depict a cross-sectional view of a semiconductor device shown after respective fabrication operations, in accordance with one or more embodiments.

In embodiments of the present invention, the retained stressed layer 300 portions, which may be referred to herein as stressed portions 300, may be located vertically in line with the channel regions of the associated FETs (as exemplarily depicted in FIG. 8), or alternatively, may be located vertically in line with source/drain regions of the associated FETs (as is exemplarily depicted in FIG. 7). For example, sidewalls of the stressed portions 300 may be between respective sidewalls of an underlying gate spacer.

FIG. 7 depicts cross-sectional views of stacked semiconductor device 299 shown after respective fabrication operations, in accordance with one or more embodiments. At the present fabrication stage, semiconductor device 100 includes stressed portions 300 that were formed from a first stressed layer 300 to have an intrinsic tensile stress within nFET channel region 116 within nFET region 402 and stressed portions 300 that were formed from a second stressed layer 300 to have an intrinsic compressive stress within its pFET channel region 116 within pFET region 404.

In nFET region 402, the first stressed portions 300 are located vertically in line with source/drain region 130 and drain/source region 132, respectively, and haves an earlier internal tensile stress that, after equilibrium, results in the shrinking of the underlying ETSOI layer 108 horizontally in the directions toward the source/drain regions. This results in the atoms within the ETSOI layer 108 being spaced closer together. As such, the first stressed portions 300 creates an intrinsic pulling inward compressive stress within ETSOI layer 108 between the first stressed portions 300 and the source/drain region 130 and the drain/source region 132, respectively, horizontally in the directions toward the source/drain regions, as depicted. This intrinsic compressive stress within ETSOI layer 108 results in tensile stress within ETSOI channel region 116. Specifically, the intrinsic tensile stress within ETSOI channel region 116 improves electron mobility within the n-type FET within nFET region 402.

In pFET region 404, the second stressed portions 300 are located vertically in line with source/drain region 130 and drain/source region 132, respectively, and earlier have an internal compressive stress that, after equilibrium, results in the pulling of the underlying ETSOI layer 108 horizontally in directions toward the center of the channel region 116. This, in turn, will space atoms within the ETSOI layer 108 further apart. As such, the second stressed portions 300 may result in an intrinsic pulling outward tensile stress within ETSOI layer 108 between the second stressed portions 300 and the source/drain region 130 and the drain/source region 132, respectively, horizontally in the directions toward the center of the channel region 116, as depicted. This intrinsic tensile stress within ETSOI layer 108 creates compressive stress within ETSOI channel region 116. Specifically, the intrinsic compressive stress within ETSOI channel region 116 improves hole mobility within the p-type FETs within pFET region 404.

Figure 8:
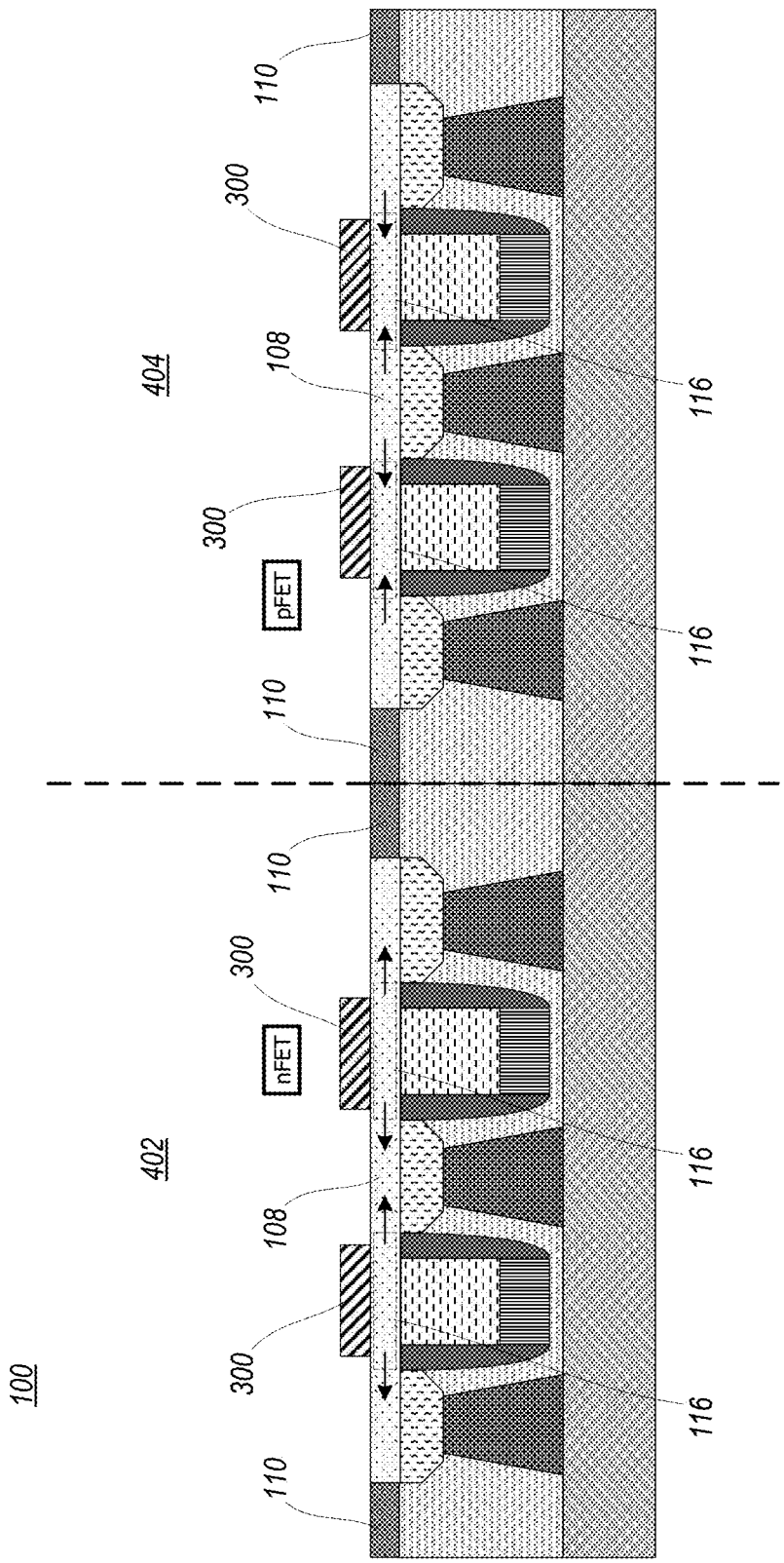

FIG. 8 depicts cross-sectional views of stacked semiconductor device 299 shown after respective fabrication operations, in accordance with one or more embodiments. At the present fabrication stage, semiconductor device 100 includes stressed portions 300 that were formed from a first stressed layer 300 to have an intrinsic tensile stress within nFET channel region 116 within nFET region 402 and stressed portions 300 that were formed from a second stressed layer 300 to have an intrinsic compressive stress within its pFET channel region 116 within pFET region 404.

In nFET region 402, the first stressed portions 300 are located vertically in line with channel region 116 and have an earlier internal compressive stress that results, after equilibrium, in the pulling of the underlying ETSOI layer 108 horizontally in the directions toward the source/drain regions. This, in turn, will space atoms within the ETSOI layer 108 further apart. As such, the first stressed portions 300 create an intrinsic pulling outward tensile stress within ETSOI layer 108 horizontally in the directions toward the source/drain regions, as depicted. This intrinsic tensile stress within ETSOI layer 108 may improve electron mobility therewithin. Specifically, the intrinsic tensile stress within ETSOI layer 108 may improve electron mobility through channel region 116 within the n-type FET within nFET region 402.

In pFET region 404, the second stressed portions 300 are located vertically in line with channel region 116 and have an earlier internal tensile stress that results, after equilibrium, in the shrinking of the underlying ETSOI layer 108 horizontally in directions toward the center of the channel region 116. This, in turn, will space atoms within the ETSOI layer 108 closer together. As such, the second stressed portions 300 may create an intrinsic pulling inward compressive stress within ETSOI layer 108 horizontally in the directions toward the center of the channel region 116, as depicted. This intrinsic compressive stress within ETSOI layer 108 may improve hole mobility therewithin. Specifically, the intrinsic compressive stress within ETSOI layer 108 may improve hole mobility through channel region 116 within the p-type FETs within pFET region 404.

In alternative embodiments, stressed portions 300 may be formed of the same stressed layer. For example, stressed portions 300 that have an earlier intrinsic compressive stress may be formed in line with the channel region 116 in nFET region 402 and may be formed in line with the source/drain region(s) with pFET region 404. Alternatively, stressed portions 300 that have an earlier intrinsic tensile stress may be formed in line with the source/drain region(s) in nFET region 402 and may be formed in line with the channel region(s) 116 with pFET region 404.

Figure 9:
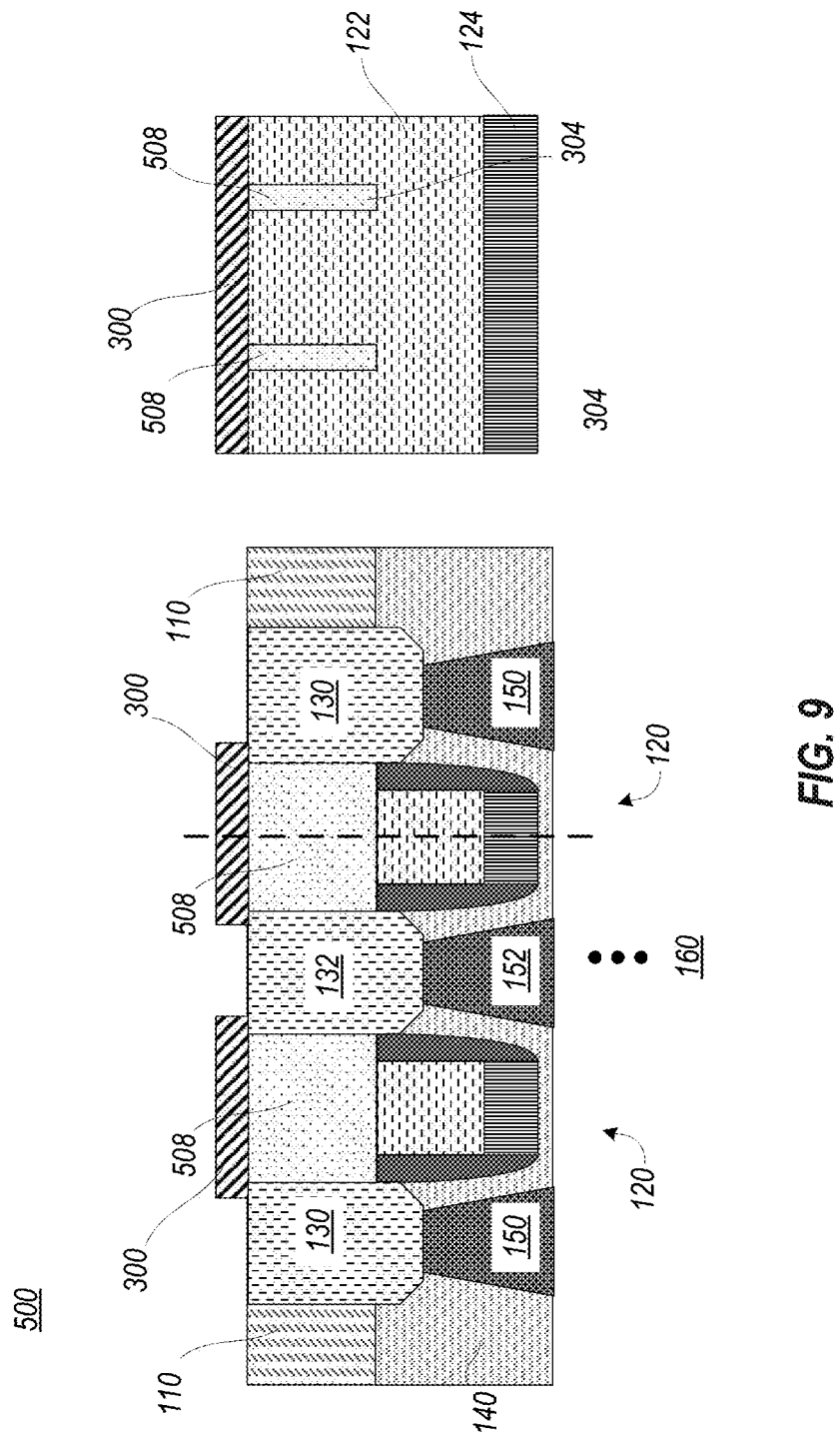
FIG. 9 depicts a cross-sectional view of a semiconductor device shown after respective fabrication operations, in accordance with one or more embodiments.

FIG. 9 is a cross-sectional view of semiconductor device 500 that includes an SOI substrate 102, in accordance with an embodiment of the present invention.

SOI substrate 102 includes a semiconductor substrate 104, a buried insulator 106 upon the semiconductor substrate 104, and a semiconductor layer 108 upon the buried insulator 106. In the present embodiment, the semiconductor layer 108 may be an finFET fin layer 108 formed over the buried insulator 106.

The semiconductor layer 108 can comprise any of the semiconductor materials as ETSOI layer 108, and descriptions thereof are not reproduced herein. The finFET fin layer 108 may be thicker than the ETSOI layer 108.

A dummy gate (not shown) with sidewall spacers 126 may be formed over an channel region 116 of the FinFET fin 508. Raised source/drain region 130 and raised drain/source region 132 may be formed upon an associated FinFET fin 508 source/drain region 112 and an associated FinFET fin 508 drain/source region 114. The raised source/drain region 130 and the raised drain/source region 132 may be formed next to the dummy gate, in accordance with an embodiment of the present invention. The raised source/drain region 130 and the raised drain/source region 132 may be epitaxially formed utilizing the sidewalls of the FinFET fin 508 as the source or growth plane and may result in diamond shaped raised source/drain region 130 and diamond shaped raised drain/source region 132, as depicted.

In various embodiments, semiconductor device 500 fabrication can be followed by forming isolation 110 (e.g., shallow trench isolation (STI)), forming a dummy gate (not shown), forming sidewall spacers 126 on opposed ends of the dummy gate, forming FinFET fin 508 source/drain region 112, forming FinFET fin 508 drain/source region 114, forming raised source/drain region 130, and forming raised drain/source region 132.

FinFET fin 508 channel region 116 can be formed between FinFET fin 508 source/drain region 112 and FinFET fin 508 drain/source region 114. Additionally, the dummy gate can rest on a dummy gate oxide (not shown) that may be formed over the FinFET fin 508 channel region 116. The dummy gate oxide may be further positioned between bottom portions of the spacers 126. The dummy gate has a thickness greater than the thickness of the dummy gate oxide.

Isolation regions 110 may be formed by etching a trench in the substrate 102 utilizing a conventional dry etching process such as RIE or plasma etching. The trenches can optionally be lined with a conventional liner material, e.g., silicon nitride or silicon oxynitride, and then CVD or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

In various embodiments, the dummy gate may be formed by forming a dummy gate layer followed by patterning. The dummy gate can comprise a stack of materials, such as a dummy gate dielectric (e.g., silicon oxide), amorphous silicon, a dielectric cap (e.g., silicon nitride). Later in the process sequence, the dummy gate is removed, and replaced with a functional gate structure that have one or more gate dielectrics and the at least one gate conductor. The dummy gate has a thickness that is greater than the thickness of the raised source/drain region 130 and the raised drain/source region 132. The top surface of the dummy gate can be coplanar with the top surface of the spacers 126.

The spacers 126 can be formed by deposition followed by a directional etch (e.g., RIE). Spacers 126 can be formed along the sidewalls of the dummy gate. For example, spacer material such as a nitride (e.g., silicon nitride) can be deposited in a conventional manner, such as by chemical vapor deposition (CVD) or atomic layer deposition (ALD). Other techniques, which can be suitable for deposition of a nitride layer, include low-pressure CVD (LPCVD) and atmospheric pressure (CVD) (APCVD). Portions of the deposited nitride layer are subsequently etched away in a conventional manner to form the spacers 126. Spacer material can be silicon oxide, silicon oxynitride, silicon nitride, SiBCN, SiOCN, SiOC, or any suitable combination of those materials.

The dummy gate and the spacers 126 may be formed before the FinFET fin 508 source/drain region 112 and FinFET fin 508 drain/source region 114. In various embodiments, the FinFET fin 508 source/drain region 112 and the FinFET fin 508 drain/source region 114 may be formed my doping the applicable FinFET fin 508 region with the appropriate N-type or P-type dopant, The dopant can be provided to the FinFET fin 508 source/drain region 112 and the FinFET fin 508 drain/source region 114 by ion implantation. Subsequently, the FinFET fin 508 source/drain region 112 and the FinFET fin 508 drain/source region 114 may be annealed. In various embodiments, the doped FinFET fin 508 source/drain region 112 and the doped FinFET fin 508 drain/source region 114 can be n-doped or p-doped.

In various embodiments, the doped regions 112, 114 can be doped in-situ or ex-situ, for example, through ion implantation or thermal diffusion of dopants into the FinFET fin 508. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming raised source/drain region 130 and the raised drain/source region 132 can include forming an in situ doped epitaxial semiconductor material over or around the doped regions 112, 114. The term "epitaxial semiconductor material" denotes a semiconductor material that has been formed using an epitaxial deposition or growth process.

In various embodiments, semiconductor device 500 fabrication can be followed by forming an interlevel dielectric (ILD) layer 140 over the raised source/drain regions 130, 132 and the dummy gate is removed to define a recess. The ILD 140 may have a dielectric liner (e.g., silicon nitride) and a filling dielectric material (e.g., silicon oxide).

In various embodiments, ILD 140 oxide fill takes place. The ILD 140 may be planarized. The ILD 140 encompasses or envelopes or surrounds the entire raised source/drain regions 130, 132. The ILD 140 engages an outer surface of the sidewall spacers 126. In one example embodiment, the ILD 140 extends to a top point of the spacers 126. Stated differently, the ILD 140 is flush with the distal end of the spacers 126. Alternatively, as depicted ILD 140 may have a thickness greater than the height of spacers 126. Additionally, the dummy gate may be removed, and a gap or recess is presented between the inner sidewalls of spacers 126. In various embodiments, the height of the ILD 140 can be selectively reduced by chemical-mechanical polishing (CMP) and/or etching. Therefore, the planarization process can be provided by CMP. Other planarization process can include grinding and polishing.

In various embodiments, semiconductor device 500 fabrication can be followed by forming replacement gate structure 120 within the recess formed by the removal of the dummy gate, in accordance with an embodiment of the present invention. In various embodiments, the newly formed gate structure 120 includes a gate dielectric (not shown), gate conductor 122, and gate cap 124 that are deposited within the recess. The gate dielectric may contact the inner surface of the sidewall spacers 126 and a portion of the upper surface of semiconductor layer 108. The gate conductor 122 may be subsequently filled within the gate dielectric. The gate conductor 122 may be formed by deposition followed by planarization (e.g., CMP) so that it is flush or below the top surface of the gate spacers 126.

In various embodiments, semiconductor device 500 fabrication can be followed by forming contacts 150, 152, 155 over the raised source/drain region 130, the raised drain/source region 132, and the gate structure 120, respectively, and by forming middle metallization layer(s) 160, in accordance with an embodiment of the present invention.

Contacts 150, 152 may be formed within the ILD 140. Contact 150 may be formed over and be in physical contact with the raised source/drain region 130. The contact 152 may be formed over and be in physical contact with the raised drain/source region 132. The contact 155 (not shown) may be formed over and be in physical contact with the gate structure 120.

Metallization layer(s) 160 may be deposited over the top surface of the contacts 150, 152, 155 and over the top surface of the ILD 140. The thickness of the metallization layer(s) 160 can be greater than the thickness of the ETSOI layer 108.

Concerning metallization layer(s) 160, a layer of dielectric material may be blanket deposited atop the entire substrate and planarized. The deposited blanket dielectric may then patterned and etched to form holes or openings to the various contacts 150, 152, 155 and/or to other conductive wiring features there below. Following via formation, conductive interconnects 162 (not shown), 165 (not shown), 167 (not shown), 169 (not shown) are formed by depositing a conductive metal into the via holes using conventional processing, such as CVD or plating. The conductive metal can include, but is not limited to: tungsten, copper, aluminum, silver, gold, and alloys thereof. The BEOL layer can comprise one or multiple stacks of wires/vias may form the interconnects 162, 165, 167, and/or 169. Conductive interconnect 162 may be formed over and be physically connected with a conductive wiring feature there below. Conductive interconnect 165 may be formed over and be physically connected with the contact 150 there below. Conductive interconnect 167 may be formed over and be physically connected with the contact 152 there below. Conductive interconnect 169 may be formed over and be physically connected with the contact 155 there below.

For clarity, semiconductor device 500 may take the place of semiconductor device 100 in the stacked semiconductor device 299, as described herein. As such, the semiconductor substrate layer 104 and BOX layer 106 may be removed and a stressed layer 300 may be formed upon at least the backside surface of the one or more FinFET fins 508, as is described herein with respect to semiconductor device 100.

Figure 10:
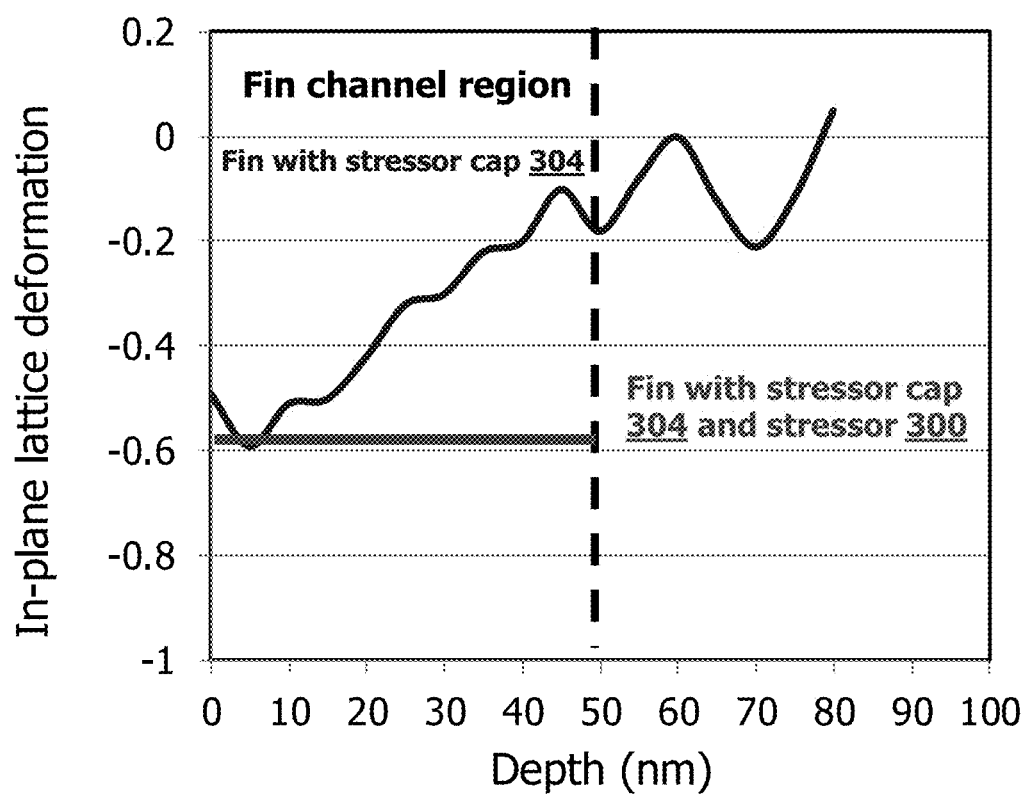
FIG. 10 depicts an exemplary plot of in-plane lattice deformation versus fin depth, in accordance with one or more embodiments.

FIG. 10 depicts an exemplary plot of in-plane lattice deformation versus fin depth, of a FinFET fin 508 of semiconductor device 500, in accordance with one or more embodiments. As is depicted, when a FinFET fin 508 includes channel stress induced from source/drain stressor and other materials fabricated on SOI substrate, there is a non-uniform induced stress distribution through the depth of the FinFET fin 308 with the highest amount of stress at the top of the FinFET fin 508. However, if the backside stressor 300 is also added to the backside of the FinFET fin 508 along with the source/drain stressor and other materials fabricated on SOI substrate, a more uniform stress distribution through the thickness of the FinFET fin 508 may be achieved. This uniform stress distribution through the thickness of the FinFET fin 508 may improve the distribution of electron or hole mobility through the FinFET fin 508 channel region 116, or the like. In other words, electron or hole mobility through the FinFET fin 508 thickness may be more uniform with both the stressor from frontside and the backside fin stressor 300, as depicted.

For clarity, the opposing surface of the exposed backside of semiconductor layer 108 that which the stressed portion 300 is formed may be referred to herein as the frontside of the semiconductor layer 108. Further, the lower surface of semiconductor device 200 as depicted in the figure(s) may be referred herein as the backside of semiconductor device 200. Similarly, due to the semiconductor device 100, 500, or the like being "flipped" and bonded to the lower semiconductor device 200 the backside of such semiconductor device 100, 500 may be the top surface of the stacked semiconductor device 299. As such, the backside of semiconductor device 100 may be oppositely facing or opposed to the backside of the semiconductor device 100, 500, etc.

Figure 11:
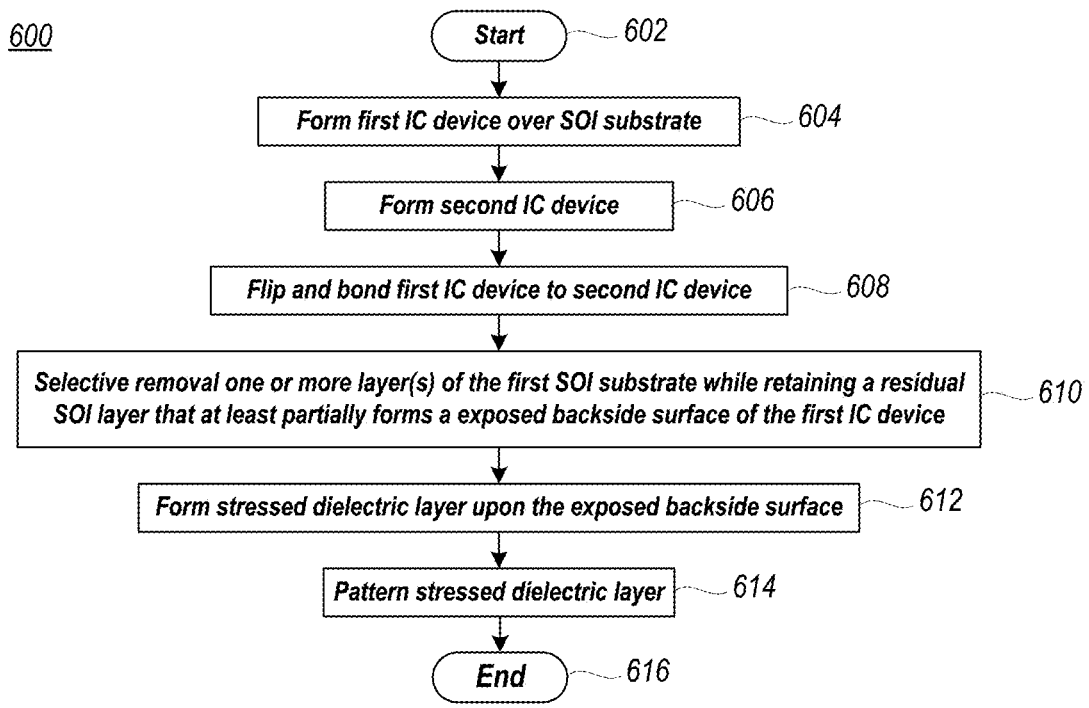
FIG. 11 depicts an exemplary flow diagram illustrating a stacked semiconductor device fabrication method, in accordance with one or more embodiments.

FIG. 11 is a flow diagram illustrating a semiconductor device fabrication method 600, in accordance with one or more embodiments. Method 600 may be exemplarily utilized to fabricate semiconductor device 299. Method 600 begins at block 602 and may continue with forming a first IC semiconductor device over or having a first SOI substrate (block 604). For example, a first ETSOI semiconductor device 100 that includes a SOI substrate 102 is formed, a first FinFET semiconductor device 500 that includes an SOI substrate 102 is formed, a first nanosheet FET semiconductor device that includes an SOI substrate 102 is formed, or the like.

Method 600 may continue with forming a second IC semiconductor device over or including a second substrate (block 606). For example, a wafer, carrier, interposer, or the like, may be formed. In some embodiments, semiconductor device 200 that includes one or more FETs (e.g. FinFETs, nanowire FETs, nanosheet FETs, gate all around FETs, etc.) may be formed.

Method 600 may continue with flipping, stacking, and bonding the first IC semiconductor device to the second IC semiconductor device (block 608). For example, TSVs 262 within the metallization layer 260 of semiconductor device 200 may be bonded to TSVs 162 within the metallization layer 160 of semiconductor device 100, TSVs 262 within the metallization layer 260 of semiconductor device 200 may be bonded to TSVs 162 within the metallization layer 160 of semiconductor device 500, or the like.

Method 600 may continue with selective removal of the semiconductor substrate layer and buried oxide layer of the first IC semiconductor device (block 610). For example, the semiconductor layer 104 and the buried oxide layer 106 above the backside surface of the semiconductor layer 108 of semiconductor device 100, 500, or the like, is removed. For example, the semiconductor substrate layer 104 is initially removed and the buried oxide layer 106 that is above the backside surface of the semiconductor layer 108 is subsequently removed. Such removal generally may expose the backside surface of the first IC semiconductor device (e.g., the backside of semiconductor layer 108 as is exemplarily shown in FIG. 4).

Method 600 may continue with forming stressed layer upon the exposed backside surface (block 612). For example, stressed layer 300 may be formed upon the backside of semiconductor layer 108. A first stressed layer 300 may impart a tensile stress upon the semiconductor layer 108 there below in nFET region 402 and may impart a compressive stress upon the semiconductor layer 108 there below in pFET region 404.

Method 600 may continue with patterning the stressed layer (block 614). For example, first stressed portions 300 may be formed within nFET region 402 that impart an intrinsic tensile stress within channel regions 116 therein and second stressed portions 300 may be formed within pFET region 404 that impart an intrinsic compressive stress within channel regions 116 therein. Method 600 may end at block 616.

The method flow diagrams depicted herein are exemplary. There can be many variations to the diagrams or operations described therein without departing from the spirit of the embodiments. For instance, the operations can be performed in a differing order, or operations can be added, deleted, or modified. All these variations are considered a part of applicable claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A stacked semiconductor device comprising:
   a lower semiconductor device comprising a first metallization layer comprising a first through metallization layer interconnect that extends entirely through the first metallization layer; and
   a flipped upper semiconductor device comprising a second metallization layer comprising a second through metallization layer interconnect that extends entirely through the second metallization layer, wherein the second through metallization layer interconnect is in contact with the first through metallization layer interconnect and wherein the first through metallization layer interconnect and the second through metallization layer interconnect have opposingly tapered sidewalls; the flipped upper semiconductor device further comprising a flipped transistor comprising a source and a drain each connected to the second metallization layer, a backside channel connected to the source and to the drain, a gate connected to the backside channel, a gate spacer between the gate and the source and between the gate and the drain, and a first stressed dielectric portion upon the backside channel that imparts an intrinsic strain within the backside channel, wherein sidewalls of the first stressed dielectric portion are vertically aligned with the gate spacer therebelow between the gate and the source and the gate and the drain.

2. The stacked semiconductor device of claim 1, wherein the backside channel is a backside residual SOI layer.

3. The stacked semiconductor device of claim 2, wherein the first stressed dielectric portion imparts an intrinsic tensile strain within a first portion of the backside residual SOI layer.

4. The stacked semiconductor device of claim 3, wherein the first stressed dielectric portion is upon the first portion of the backside residual SOI layer within an n-type field effect transistor (FET) region.

5. The stacked semiconductor device of claim 4, further comprising:
a second stressed dielectric portion upon a second portion of the backside residual SOI layer within a p-type field effect transistor (FET) region.

6. The stacked semiconductor device of claim 5, wherein the second stressed dielectric portion is located vertically in line with the second portion of the backside residual SOI layer and imparts an intrinsic compressive strain within the second portion of the backside residual SOI layer.

7. The stacked semiconductor device of claim 6, wherein a top surface of the second stressed dielectric portion is coplanar with a top surface of the first stressed dielectric portion.

8. The stacked semiconductor device of claim 2, wherein the first stressed dielectric portion is located vertically in line with an underlying first channel region of the backside residual SOI layer and imparts an intrinsic tensile strain within the underlying first channel region.

9. The stacked semiconductor device of claim 8, wherein the first stressed dielectric portion is upon the backside residual SOI layer within an n-type field effect transistor (FET) region.

10. The stacked semiconductor device of claim 9, further comprising:
a second stressed dielectric portion is upon the backside residual SOI layer within a p-type field effect transistor (FET) region.

11. The stacked semiconductor device of claim 10, wherein the second stressed dielectric portion is located vertically in line with an underlying second channel region of the backside residual SOI layer and imparts an intrinsic compressive strain within the underlying second channel region.

12. The stacked semiconductor device of claim 11, wherein a top surface of the second stressed dielectric portion is coplanar with a top surface of the first stressed dielectric portion.

13. A stacked semiconductor device comprising:
a lower semiconductor device comprising a first metallization layer comprising a first through metallization layer interconnect that extends entirely through the first metallization layer; and
a flipped upper semiconductor device comprising a second metallization layer comprising a second through metallization layer interconnect that extends entirely through the second metallization layer and is in contact with the first through metallization layer interconnect, wherein the first through metallization layer interconnect and the second through metallization layer interconnect have opposingly tapered sidewalls; the flipped upper semiconductor device further comprising a flipped transistor comprising a source and a drain each connected to the second metallization layer, a backside residual semiconductor on insulator (SOI) layer connected to the source and to the drain, a gate connected to the backside residual SOI layer, a gate spacer between the gate and the source and between the gate and the drain; a first stressed dielectric portion upon the backside residual SOI layer that imparts an intrinsic tensile strain within an underlying first channel region of the backside residual SOI layer, wherein the first stressed dielectric portion is vertically aligned with the source and a sidewall of the first stressed dielectric portion is vertically aligned with the gate spacer therebelow between the gate and the source; and a second stressed dielectric portion upon the backside residual SOI layer that imparts an intrinsic compressive strain within an underlying second channel region of the backside residual SOI layer, wherein the second stressed dielectric portion is vertically aligned with the drain and a sidewall of the second stressed dielectric portion is vertically aligned with the gate spacer therebelow between the gate and the drain.

14. A stacked semiconductor device comprising:
a lower semiconductor device comprising a lower interconnect that has first tapered sidewalls; and
a flipped upper semiconductor device comprising an upper interconnect that has second tapered sidewalls oppositely tapered relative to the first tapered sidewalls, the flipped upper semiconductor device bonded to the lower semiconductor device, the flipped upper semiconductor device comprising a flipped transistor comprising a source and a drain, an upper channel connected to the source and to the drain, a gate connected to the upper channel, a gate spacer between the gate and the source and between the gate and the drain, and a stressed dielectric portion directly upon the upper channel that imparts an intrinsic strain within the upper channel, wherein sidewalls of the stressed dielectric portion are vertically aligned with the gate spacer therebelow between the gate and the source and the gate and the drain.

* * * * *